(12) United States Patent
Xu

(10) Patent No.: US 11,405,062 B1
(45) Date of Patent: Aug. 2, 2022

(54) STARTUP CIRCUIT DEVICE, FILTER AND RECEIVER

(71) Applicant: Hangzhou Geo-chip Technology Co., Ltd., Hangzhou (CN)

(72) Inventor: Li Xu, Hangzhou (CN)

(73) Assignee: Hangzhou Geo-chip Technology Co., Ltd., Hangzhou (CN)

( * ) Notice: Subject to any disclaimer, the term of this patent is extended or adjusted under 35 U.S.C. 154(b) by 0 days.

(21) Appl. No.: 17/331,053

(22) Filed: May 26, 2021

(51) Int. Cl.
| | |
|---|---|
| *H04B 1/16* | (2006.01) |
| *H04B 1/18* | (2006.01) |
| *H03F 3/45* | (2006.01) |
| *H04B 1/10* | (2006.01) |
| *H03G 3/30* | (2006.01) |

(52) U.S. Cl.
CPC ....... *H04B 1/1607* (2013.01); *H03F 3/45076* (2013.01); *H04B 1/1018* (2013.01); *H04B 1/18* (2013.01); *H03F 2200/294* (2013.01); *H03G 3/3052* (2013.01)

(58) Field of Classification Search
CPC ......... H03F 2200/222; H03F 2200/267; H03F 3/45071; H04B 1/16; H04B 1/18; H04B 1/04; H04B 1/06; H04B 1/1018; H03G 3/30
See application file for complete search history.

(56) References Cited

U.S. PATENT DOCUMENTS

2005/0218985 A1* 10/2005 Lebedev ............. H03F 3/45654 330/258
2017/0331432 A1* 11/2017 Zhang ..................... H03F 1/301

* cited by examiner

*Primary Examiner* — Nhan T Le
(74) *Attorney, Agent, or Firm* — Nixon & Vanderhye P.C.

(57) ABSTRACT

The present disclosure discloses a startup circuit device, a filter and a receiver. The startup circuit device is applicable to the filter that includes a fully-differential operational amplifier and a common-mode feedback circuit device connected in sequence. Both the first startup input terminal and the first startup output terminal are connected to a first amplification input terminal of the fully-differential operational amplifier, and both the second startup input terminal and the second startup output terminal are connected to a second amplification input terminal of the fully-differential operational amplifier. The startup circuit device is configured to adjust a received input voltage to a target voltage during startup of the fully-differential operational amplifier, and output the target voltage to the fully-differential operational amplifier, such that the fully-differential operational amplifier operates at the target voltage, and stability of the fully-differential operational amplifier during the startup can be improved effectively.

9 Claims, 4 Drawing Sheets

STARTUP CIRCUIT DEVICE, FILTER AND RECEIVER

TECHNICAL FIELD

The present disclosure relates to the field of communication technologies, and in particular to a startup circuit device, a filter, and a receiver.

BACKGROUND

In a traditional receiver, a radio frequency signal received from an antenna may be sequentially passed through a band-pass filter or low-pass filter, a matching network (MN), a low noise amplifier (LNA), a mixer, another band-pass filter, an analog-to-digital converter (ADC) and a digital demodulator on a printed circuit board (PCB) to obtain the desired signal. The band-pass filter herein includes a fully-differential operational amplifier and a common-mode feedback (CMFB) circuit. Generally, the fully-differential operational amplifier is expected to operate at a static operating point, for example, with an input voltage and an output voltage of the amplifier being fixed at a preset value. The common-mode feedback circuit is used to stabilize the static operating point of the fully-differential operational amplifier, that is, to fix values of the common mode voltages input to and output from the amplifier at the preset value. However, the common-mode feedback circuit not only consumes a lot of power, but also cannot well stabilize the static operating point of the fully-differential operational amplifier at the preset value upon powering-up, as a result, the static operating point may become higher or lower than the preset value. In this case, the fully-differential operational amplifier may fall into a non-operating state, resulting in a poor operating stability of the fully-differential operational amplifier.

SUMMARY

The present disclosure provides a startup circuit device, a filter, and a receiver to solve one or more technical problems in the prior art.

In a first aspect, the embodiments of the present application provide a startup circuit device applicable to a filter including a fully-differential operational amplifier and a common-mode feedback circuit device connected in sequence. The startup circuit device includes a first startup input terminal, a second startup input terminal, a first startup output terminal and a second startup output terminal, where the first startup input terminal is connected to a first amplification input terminal of the fully-differential operational amplifier, the second startup input terminal is connected to a second amplification input terminal of the fully-differential operational amplifier, the first startup output terminal is connected to the first amplification input terminal, and the second startup output terminal is connected to the second amplification input terminal.

The startup circuit device is configured to adjust a received input voltage to a target voltage during startup of the fully-differential operational amplifier, and output the target voltage to the fully-differential operational amplifier, such that the fully-differential operational amplifier operates at the target voltage.

According to an embodiment, the startup circuit device includes a first resistor, a second resistor, a comparator, a first transistor, and a second transistor.

An end of the first resistor serves as the first startup input terminal, and an end of the second resistor serves as the second startup input terminal; both another end of the first resistor and another end of the second resistor are connected to an input terminal of the comparator, and an output terminal of the comparator is connected to both a gate of the first transistor and a gate of the second transistor.

The gate of the first transistor and the gate of the second transistor are connected to each other; a drain of the first transistor serves as the first startup output terminal, and a drain of the second transistor serves as the second startup output terminal; and both a source of the second transistor and a source of the first transistor are grounded or connected to a power supply terminal $V_{DD}$.

The input terminal of the comparator is configured to receive an average value of the input voltage, the average value being acquired by dividing the input voltage by the first resistor and the second resistor; and the output terminal of the comparator is configured to output a high level or a low level based on a comparison result between a threshold voltage and the average value of the input voltage.

The first transistor and the second transistor are configured to pull up or down the average value of the input voltage to the target voltage according to the high level or the low level, where the threshold voltage is greater than or equal to the target voltage.

In an embodiment, the output terminal of the comparator is configured to output a high level when the comparison result shows that the average value of the input voltage is greater than the threshold voltage.

The first transistor and the second transistor are both NMOS transistors and configured to be turned on after receiving the high level and thereby pull down the average value of the input voltage to the target voltage.

In an embodiment, the output terminal of the comparator is configured to output the low level when the average value of the input voltage is pulled down to the target voltage and less than or equal to the threshold voltage.

The first transistor and the second transistor are configured to be turned off after receiving the low level, such that the fully-differential operational amplifier operates at the target voltage.

In an embodiment, the output terminal of the comparator is configured to output the low level when the average value of the input voltage is less than the threshold voltage.

The first transistor and the second transistor are both PMOS transistors and configured to be turned on after receiving the low level and thereby pull up the average value of the input voltage to the target voltage.

In an embodiment, the comparator includes a third transistor, a fourth transistor, a fifth transistor, and a sixth transistor.

A gate of the third transistor of the comparator is connected to a gate of the fourth transistor of the comparator, and serves as the input terminal of the comparator; a drain of the third transistor of the comparator and a drain of the fourth transistor of the comparator are connected to a first connection point; a source of the third transistor of the comparator is connected to a source of the fifth transistor of the comparator; and a source of the fourth transistor of the comparator is grounded.

A gate of the fifth transistor of the comparator and a gate of the sixth transistor of the comparator are connected to a second connection point which is connected to the first connection point; a drain of the fifth transistor of the comparator is connected to a drain of the sixth transistor of the comparator, and serves as the output terminal of the comparator; and a source of the sixth transistor of the comparator is grounded.

In an embodiment, the comparator includes a comparison module and a reference voltage source that provides the threshold voltage.

The comparison module includes a first comparison input terminal and a second comparison input terminal, where the first comparison input terminal serves as the input terminal of the comparator; the second comparison input terminal is connected to an end of the reference voltage source, and another end of the reference voltage source is grounded; and an output terminal of the comparison module serves as the output terminal of the comparator and is connected to both the gate of the first transistor and the gate of the second transistor.

In an embodiment, the comparison module includes a seventh transistor, an eighth transistor, a ninth transistor, a tenth transistor, and an eleventh transistor.

A gate of the seventh transistor of the comparison module serves as the first comparison input terminal, a gate of the eighth transistor of the comparison module serves as the second comparison input terminal, and a source of the seventh transistor of the comparison module and a source of the eighth transistor of the comparison module are grounded.

A drain of the seventh transistor of the comparison module is connected to a drain of the ninth transistor of the comparison module; a drain of the eighth transistor of the comparison module is connected to a drain of the tenth transistor of the comparison module; a drain of the ninth transistor of the comparison module is connected to a gate of the ninth transistor of the comparison module; and a gate of the ninth transistor of the comparison module is connected to a gate of the tenth transistor of the comparison module.

A source of the ninth transistor of the comparison module, a source of the tenth transistor of the comparison module, and a source of the eleventh transistor of the comparison module are connected; a gate of the eleventh transistor of the comparison module is connected to a drain of the tenth transistor of the comparison module; and a drain of the eleventh transistor of the comparison module is grounded and serves as the output terminal of the comparison module.

In a second aspect, the embodiments of the present disclosure provide a filter, including at least one startup circuit device described above.

In a third aspect, the embodiments of the present disclosure provide a receiver, including at least one filter described above.

The present disclosure adopting the aforesaid technical solutions may have following advantages. During startup of the fully-differential operational amplifier, the common-mode feedback circuit device may be at a low power consumption mode and thus cannot fix the operating voltage of the fully-differential operational amplifier at the target voltage. Under this case, the input voltage can be received and adjusted by the startup circuit device to a target voltage, which enables the fully-differential operational amplifier to operate at the target voltage, and thereby effectively improves the stability of the fully-differential operational amplifier during the startup.

The above summary is only for the purpose of description and is not intended to be construed as any limitation. In addition to the illustrative aspects, embodiments, and features described above, further aspects, embodiments, and features of the present disclosure will be easily understood by referring to the accompanying drawings and the following detailed description.

BRIEF DESCRIPTION OF THE DRAWINGS

In the drawings, unless otherwise specified, the same reference characters refer to the same or similar components or elements throughout the drawings, and the drawings are not necessarily drawn to scale. It should be understood that these drawings only depict some embodiments disclosed according to the present disclosure, and should not be regarded as limiting the scope of the present disclosure. The drawings means to facilitate understanding of the solution, and do not constitute a limitation to the present disclosure. In the drawings.

Figure 1:
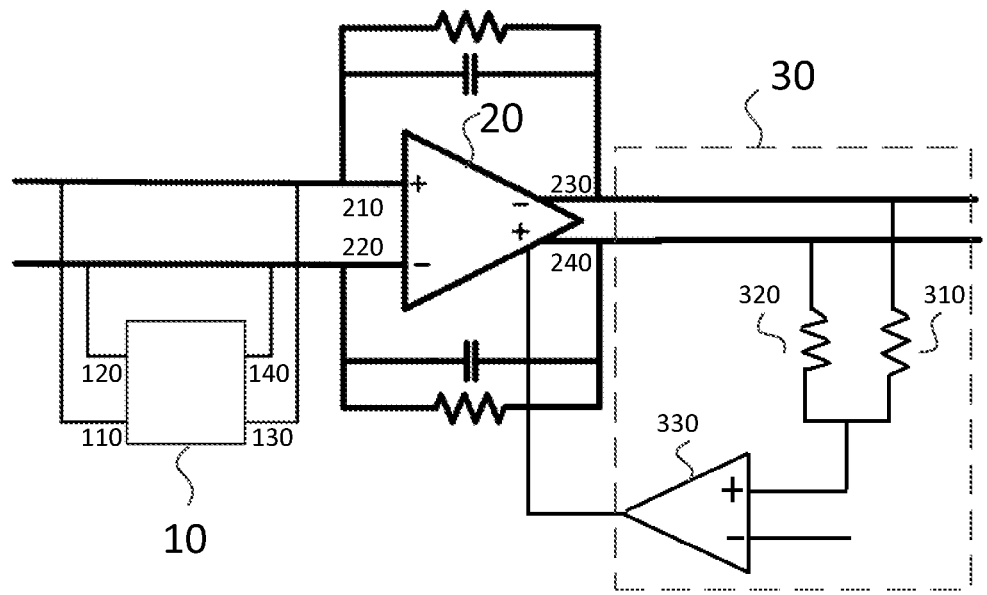
FIG. 1 is a schematic structural diagram of a filter according to an embodiment of the present disclosure.

| List of reference characters | | | |
| --- | --- | --- | --- |
| 10 | Startup circuit device | | |
| 110 | First startup input terminal | 120 | Second startup input terminal |
| 130 | First startup output terminal | 140 | Second startup output terminal |
| 20 | Fully-differential operational amplifier | | |
| 210 | First amplification input terminal | 220 | Second amplification input terminal |
| 230 | First amplification output terminal | 240 | Second amplification output terminal |
| 30 | Common-mode feedback circuit device | | |
| 310 | First feedback resistor | 320 | Second feedback resistor |
| 330 | Common-mode feedback comparator | | |
| 11 | First resistor | 12 | Second resistor |
| 13 | Comparator | | |
| 131 | Input terminal of the comparator | 132 | Output terminal of the comparator |

-continued

| List of reference characters | | | |
|---|---|---|---|
| 14, 14' | First transistor | 15, 15' | Second transistor |
| 133 | Third transistor | 134 | Fourth transistor |
| 135 | Fifth transistor | 136 | Sixth transistor, |
| A | First connection point | B | Second connection point |
| 137 | Comparison module | 138 | First comparison input terminal |
| 138' | Second comparison input terminal | 139 | Reference voltage source |
| 1371 | Seventh transistor | 1372 | Eighth transistor |
| 1373 | Ninth transistor | 1374 | Tenth transistor |
| 1375 | Eleventh transistor | | |

DETAILED DESCRIPTION

Only certain exemplary embodiments are briefly described hereinafter. As can be appreciated by those skilled in the art, the described embodiments may be modified in various different ways without departing from the spirit or scope of the present disclosure. Therefore, the drawings and description should be regarded as illustrative in nature rather than as restrictive.

In the description of the present disclosure, it should be understood that, orientation or position relationships indicated by the terms "center", "longitudinal", "transversal", "length", "width", "thickness", "upper", "lower", "front", "rear", "left", "right", "vertical", "horizontal", "top", "bottom", "inner", "outer", "clockwise", "counterclockwise", "axial", "radial", "circumferential", or the like are based on the orientation or position relationships as shown in the drawings, which are merely for the sake of convenient and simplified description the present disclosure rather than indicating or implying that the involved device or element necessarily has or operates in the particular orientation. Therefore, these terms should not be understood as a limitation to the present disclosure.

In addition, the terms such as "first" and "second" are merely for a descriptive purpose, and cannot be understood as indicating or implying a relative importance, or implicitly indicating the number of the involved technical features. Hence, the features defined with "first" and "second" can explicitly or implicitly include one or more such features. In the description of the present disclosure, "a plurality of" refers to two or more in number, unless otherwise specifically defined.

In the present disclosure, unless otherwise specified and defined explicitly, the terms such as "installed", "connected" and "fixed" should be comprehended in a broad sense. For example, these terms may refer to a fixed or detachable connection or being integrated; a mechanical, electrical or communication connection; a direct connection or an indirect connection via an intermediate medium; or a communication between interiors of two elements or an interaction between two elements. The specific meanings of the foregoing terms in the present disclosure may be understood by those skilled in the art according to specific context.

In the present disclosure, unless otherwise specified and defined, the expression that a first feature is "above" or "below" a second feature may include a meaning that the first and second features are in direct contact with each other, and may further include a meaning that the first and second features are not in direct contact with each other with an additional feature placed therebetween. Moreover, the expression that the first feature is "on", "over" or "above" the second feature may include a meaning that the first feature is right above or obliquely above the second feature, or simply means that the first feature is higher in level than the second feature. Likewise, the expression that the first feature is "under", "below" or "beneath" the second feature may include a meaning that the first feature is right below or obliquely below the second feature, or simply means that the first feature is lower in level than the second feature.

The following disclosure provides many various embodiments or examples for illustrating the implementation of various structures of the present disclosure. In order to simplify the disclosure of the present disclosure, the components and configurations of specific examples are described hereinafter. Of course, they are merely illustrative but not intended to limit the present disclosure. In addition, the same reference numerals and/or characters may be used throughout different examples in the present disclosure for the sake of simplification and clarity, but do not necessarily indicate any relationship between the various embodiments and/or examples. Furthermore, the present disclosure provides examples of various specific processes and materials, but those of ordinary skill in the art may readily contemplate the application of other processes and/or the use of other materials.

As shown in FIG. 1, a filter includes a fully-differential operational amplifier 20 and a common-mode feedback circuit device 30.

The fully-differential operational amplifier 20 includes a first amplification input terminal 210, a second amplification input terminal 220, a first amplification output terminal 230, and a second amplification output terminal 240. A resistor is connected in parallel between the first amplification input terminal 210 and the first amplification output terminal 230, and a capacitor may be connected in parallel with the resistor. Another resistor may be connected in parallel between the second amplification input terminal 220 and the second amplification output terminal 240, and another capacitor may be connected in parallel with the another resistor. Both the first amplification output terminal 230 and the second amplification output terminal 240 are connected to the common-mode feedback circuit device 30.

The common-mode feedback circuit device 30 includes a first feedback resistor 310, a second feedback resistor 320 and a common-mode feedback comparator 330. The first feedback resistor 310 has one end connected to the first amplification output terminal 230, and the second feedback resistor 320 has one end connected to the second amplification output terminal 240. The first feedback resistor 310 and the second feedback resistor 320 have respective other ends both connected to a positive input end of the common-mode feedback comparator 330. The common-mode feedback comparator 330 has a negative input terminal configured to receive a target voltage as input and an output terminal connected to a control terminal of the fully-differential operational amplifier 20, the control terminal being configured to stabilize an operating voltage of the fully-differential operational amplifier 20 at the target voltage.

Input voltages received by the first amplification input terminal 210 and the second amplification input terminal 220 are common-mode input voltages, and output voltages acquired by the first amplification output terminal 230 and the second amplification output terminal 240 are common-mode output voltages that are equal to the common-mode input voltages. When the common-mode feedback circuit device 30 has a strong function (having a large power consumption), the common-mode feedback circuit device 30 may stabilize the common-mode input voltage at the target voltage. However, when the filter is activated (powered on), that is, during startup (power-on) of the fully-differential operational amplifier 20, the common-mode feedback circuit device 30 may have a poor function (having a low power consumption) and thus cannot stabilize the common-mode input voltage at the target voltage, which causes the fully-differential operational amplifier 20 to have a poor operating stability.

In order to solve the problem, this embodiment proposes to connect a startup circuit device 10 to the input end of the fully-differential operational amplifier 20, such that the common-mode input voltage may be adjusted to the target voltage by the startup circuit device 10, which enables the fully-differential operational amplifier 20 to operate stably at the target voltage and thereby effectively improves the operating stability of the fully-differential operational amplifier 20.

In an embodiment, as shown in FIG. 1, a startup circuit device 10 applicable to a filter is provided. The startup circuit device 10 includes a first startup input terminal 110, a second startup input terminal 120, a first startup output terminal 130 and a second startup output terminal 140. The first startup input terminal 110 is connected to a first amplification input terminal 210 of the fully-differential operational amplifier 20, the second startup input terminal 120 is connected to a second amplification input terminal 220 of the fully-differential operational amplifier 20, the first startup output terminal 130 is connected to the first amplification input terminal 210, and the second startup output terminal 140 is connected to the second amplification input terminal 220.

The startup circuit device 10 is configured to adjust a received input voltage to a target voltage during startup of the fully-differential operational amplifier 20, and output the target voltage to the fully-differential operational amplifier, such that the fully-differential operational amplifier 20 operates at the target voltage.

In an example, the first startup input terminal 110 and the second startup input terminal 120 are both configured to receive the input voltage; and the first startup output terminal 130 and the second startup output terminal 140 are both configured to output, to the fully-differential operational amplifier 20, the target voltage acquired by adjusting the input voltage.

Figure 2:
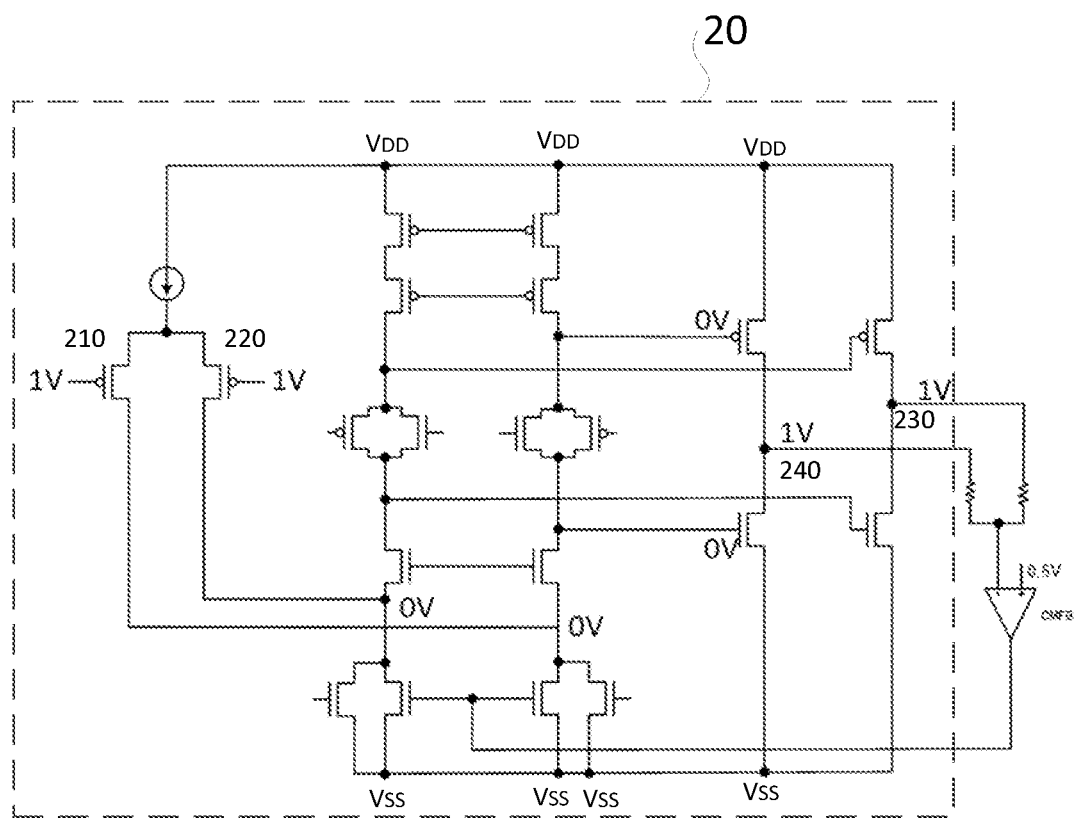
FIG. 2 is a schematic structural diagram of a fully-differential operational amplifier according to an embodiment of the present disclosure.

FIG. 2 shows an internal structure of the fully-differential operational amplifier 20. In the internal structure of the fully-differential operational amplifier 20, if the first amplification input terminal 210 and the second amplification input terminal 220 are respectively gates of PMOS transistors, each PMOS transistor may be turned off when the input voltage is 1 v during startup of the fully-differential operational amplifier 20, and no current flows through the fully-differential operational amplifier 20, which causes the fully-differential operational amplifier 20 to stop operating and no longer have the operational amplifier function. The input voltage may then be pulled down to the target voltage of 0.5 v by the startup circuit device 10. When the target voltage of 0.5 v is input to the first amplification input terminal 210 and the second amplification input terminal 220, each PMOS transistor may be turned on, and the current may flow through the fully-differential operational amplifier 20, such that the fully-differential operational amplifier 20 can stably operate at the target voltage of 0.5 v. Thus, a relatively great gain can be acquired through the fully-differential operational amplifier 20. Similarly, in the internal structure of the fully-differential operational amplifier 20, if the first amplification input terminal 210 and the second amplification input terminal 220 are respectively gates of NMOS transistors (not shown in the drawings), each NMOS transistor may be turned off when the input voltage is 0.2 v during startup of the fully-differential operational amplifier 20, and no current flows through the fully-differential operational amplifier 20, which causes the fully-differential operational amplifier 20 to stop operating. The input voltage 0.2 v may then be pulled up to the target voltage of 0.5 v by the startup circuit device 10. When the target voltage of 0.5 v is input to the first amplification input terminal 210 and the second amplification input terminal 220 of the fully-differential operational amplifier 20, each NMOS transistor may be turned on, and the current may flow through the fully-differential operational amplifier 20, such that the fully-differential operational amplifier 20 can operate stably at the target voltage of 0.5 v. Thus, a relatively great gain can be acquired through the fully-differential operational amplifier 20.

In this embodiment, during startup of the fully-differential operational amplifier 20, the common-mode feedback circuit device 30 may be at a low power consumption mode and thus cannot fix the operating voltage of the fully-differential operational amplifier 20 at the target voltage. Under this case, the input voltage can be received and adjusted by the startup circuit device 10 to a target voltage, which enables the fully-differential operational amplifier 20 to operate at the target voltage, and thereby effectively improves the stability of the fully-differential operational amplifier 20 during the startup.

Figure 3:
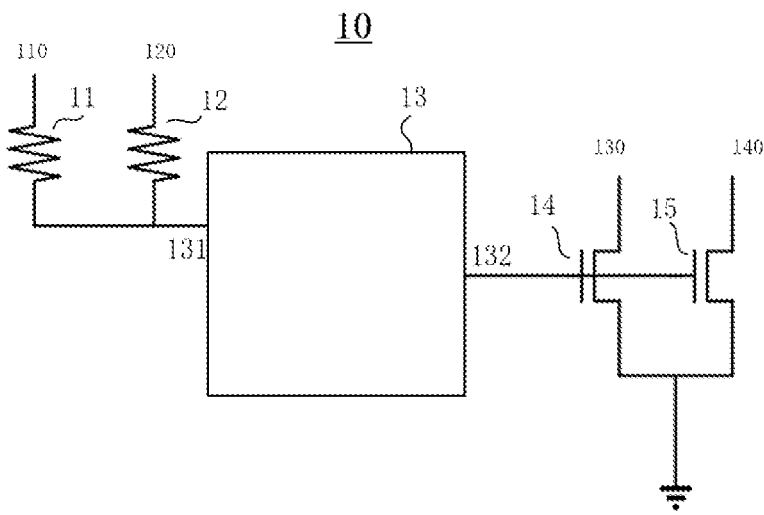
FIG. 3 is a schematic structural diagram of a startup circuit device according to an embodiment of the present disclosure.

In an embodiment, as shown in FIG. 3, the startup circuit device 10 includes a first resistor 11, a second resistor 12, a comparator 13, a first transistor 14, and a second transistor 15.

An end of the first resistor 11 serves as the first startup input terminal 110, and an end of the second resistor 12 serves as the second startup input terminal 120. Both another end of the first resistor 11 and another end of the second resistor 12 are connected to an input terminal 131 of the comparator, and an output terminal 132 of the comparator is connected to both a gate of the first transistor 14 and a gate of the second transistor 15.

The gate of the first transistor 14 and the gate of the second transistor 15 are connected to each other. A drain of the first transistor 14 serves as the first startup output terminal 130, a drain of the second transistor 15 serves as the second startup output terminal 140, and both a source of the first transistor 14 and a source of the second transistor 15 are grounded or connected to a power supply terminal $V_{DD}$.

The input terminal 131 of the comparator is configured to receive an average value of the input voltage which is acquired after dividing the input voltage by the first resistor 11 and the second resistor 12. The output terminal 132 of the comparator is configured to output a high level or a low level based on a comparison result between a threshold voltage and the average value of the input voltage.

The first transistor 14 and the second transistor 15 are configured to pull up or down the average value of the input voltage to the target voltage according to the high level or the low level. The threshold voltage is greater than or equal to the target voltage.

In an example, in the startup circuit device 10, the average value of the input voltage is acquired after dividing the input voltage by the first resistor 11 and the second resistor 12. Then, the average value of the input voltage is input to the comparator 13 that compares the average value of the input voltage with the threshold voltage. If the comparison result shows that the average value of the input voltage (e.g., 1 v) is greater than the threshold voltage (e.g., 0.6 v), the startup circuit device 10 pulls down the average value of the input voltage to the target voltage (e.g., 0.5 v). If the comparison result shows that the average value of the input voltage (e.g., 0.2 v) is less than the threshold voltage (e.g., 0.6 v), the startup circuit device 10 pulls up the average value of the input voltage to the target voltage (e.g., 0.5 v). Afterwards, the first startup output terminal 130 and the second startup output terminal 140 output the target voltage to the fully-differential operational amplifier 20 to thereby enable the fully-differential operational amplifier 20 to operate stably at the target voltage.

The target voltage is the voltage ensuring stable operating of the fully-differential operational amplifier 20. Considering the influence of corner variation and temperature variation on the transistors in the fully-differential operational amplifier 20, the actual voltage of the fully-differential operational amplifier 20 may be greater than the target voltage. Therefore, considering such an actual situation, the threshold voltage may be set to be greater than the target voltage to improve the accuracy of the startup circuit device 10 in adjusting the input voltage. For example, the target voltage is set as 0.5 v. Under the influence of corner variation and temperature variation, the actual voltage of the fully-differential operational amplifier 20 may be 0.6 v. Thus, the threshold voltage may be set as 0.6 v.

Figure 4:
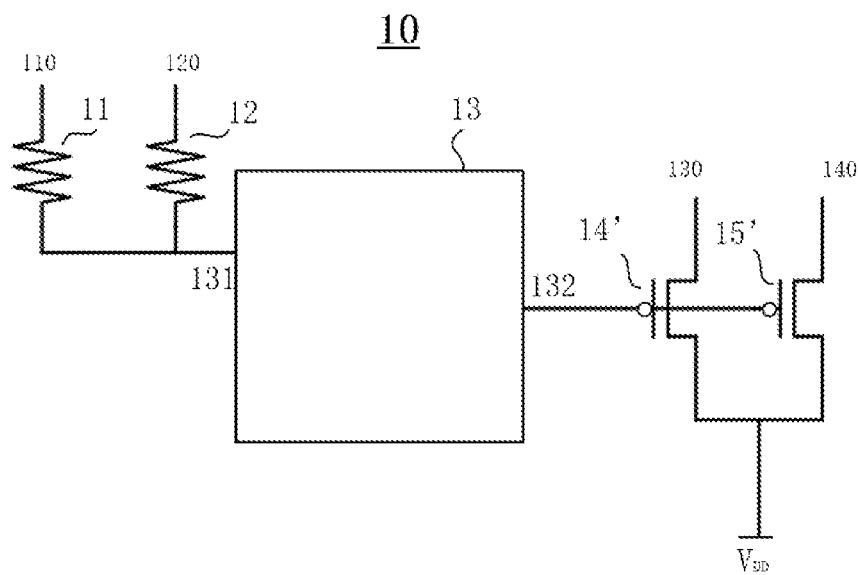
FIG. 4 is a schematic structural diagram of another startup circuit device according to an embodiment of the present disclosure.

It should be pointed out that the first transistor 14 and the second transistor 15 in FIG. 3 may be NMOS transistors, or the NMOS transistors may be replaced by PMOS transistors. For example, as shown in FIG. 4, the first transistor 14' and the second transistor 15' may be PMOS transistors, which also fall within the protection scope of this embodiment.

In an embodiment, the output terminal 132 of the comparator is configured to output a high level when the comparison result shows that the average value of the input voltage is greater than the threshold voltage.

The first transistor 14 and the second transistor 15 are both NMOS transistors and configured to be turned on after receiving the high level and thereby pull down the average value of the input voltage to the target voltage.

In an embodiment, the output terminal 132 of the comparator is configured to output the low level when the average value of the input voltage is pulled down to the target voltage and the average value of the input voltage is less than or equal to the threshold voltage.

The first transistor 14 and the second transistor 15 are configured to be turned off after receiving the low level, such that the fully-differential operational amplifier 20 operates at the target voltage.

In an example, as shown in FIG. 3, when the average value of the input voltage is greater than the threshold voltage, the comparator 13 outputs the high level. The first transistor 14 and the second transistor 15 are both NMOS transistors, and they are turned on after receiving the high level and thereby pull down the average value of the input voltage to the target voltage. The output terminal 132 of the comparator outputs the low level when the average value of the input voltage is pulled down to the target voltage and less than or equal to the threshold voltage. The first transistor 14 and the second transistor 15 are turned off after receiving the low level, such that the fully-differential operational amplifier 20 operates at the target voltage.

In an embodiment, the output terminal 132 of the comparator is configured to output the low level when the average value of the input voltage is less than the threshold voltage.

The first transistor 14' and the second transistor 15' are both PMOS transistors and configured to be turned on after receiving the low level and thereby pull up the average value of the input voltage to the target voltage.

In an example, as shown in FIG. 4, when the average value of the input voltage is less than the threshold voltage, the comparator 13 outputs the low level. The first transistor 14' and the second transistor 15' are both PMOS transistors, and they are turned on after receiving the low level and thereby pull up the average value of the input voltage to the target voltage. When the average value of the input voltage is pulled up to the target voltage, the comparator 13 outputs the high level. After receiving the high level, the first transistor 14' and the second transistor 15' are turned off to enable the fully-differential operational amplifier 20 to operate at the target voltage.

Figure 5:
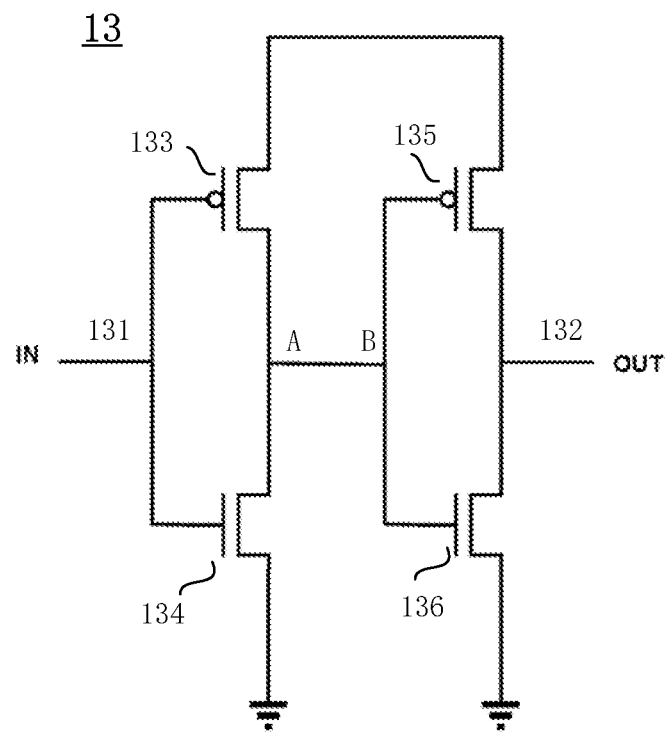
FIG. 5 is a schematic structural diagram of a comparator according to an embodiment of the present disclosure.

In an embodiment, as shown in FIG. 5, the comparator 13 includes a third transistor 133, a fourth transistor 134, a fifth transistor 135, and a sixth transistor 136.

A gate of the third transistor 133 of the comparator 13 is connected to a gate of the fourth transistor 134 of the comparator 13, and serves as the input terminal 131 of the comparator. A drain of the third transistor 133 of the comparator 13 and a drain of the fourth transistor 134 of the comparator 13 are connected to a first connection point A. A source of the third transistor 133 of the comparator 13 is connected to a source of the fifth transistor 135 of the comparator 13. A source of the fourth transistor 134 of the comparator 134 is grounded.

A gate of the fifth transistor 135 of the comparator 13 and a gate of the sixth transistor 136 of the comparator 13 are connected to a second connection point B which is connected with the first connection point A. A drain of the fifth transistor 135 of the comparator 13 is connected to a drain of the sixth transistor 136 of the comparator 13, and serves as the output terminal 132 of the comparator. A source of the sixth transistor 136 of the comparator is grounded.

In an example, the third transistor 133 may be a PMOS transistor, the fourth transistor 134 may be an NMOS transistor, the fifth transistor 135 may be a PMOS transistor, and the sixth transistor 136 may be an NMOS transistor. The third transistor 133, the fourth transistor 134, and the connection relationship therebetween constitute a first inverter. The fifth transistor 135, the sixth transistor 136, and the connection relationship therebetween constitute a second inverter.

The input terminal 131 (input terminal of the first inverter) of the comparator formed by connecting the gate of the third transistor 133 with the gate of the fourth transistor 134 is configured to receive the average value of the input voltage. Before the average value of the input voltage rises from 0 to the threshold voltage (such as 0.6 v), the third transistor 133 is turned on, the fourth transistor 134 is turned off, and the first connection point A (the output terminal of the first inverter) outputs the high level. The second connection point B (input terminal of the second inverter) inputs the high level, and the output terminal 132 (the output terminal of the second inverter) of the comparator formed by connecting the drain of the fifth transistor 135 to the drain of the sixth transistor 136 outputs the low level. The comparator outputs the low level, and after receiving the low level, the first transistor 14 and the second transistor 15 are turned off to enable the fully-differential operational amplifier 20 to operate at the target voltage.

When the average value of the input voltage rises to or even greater than 0.6 (threshold voltage), the third transistor 133 is turned off, the fourth transistor 134 is turned on, and the first connection point A (the output terminal of the first inverter) outputs the low level. The second connection point B (input terminal of the second inverter) inputs the low level, and the output terminal 132 (the output terminal of the second inverter) of the comparator formed by connecting the drain of the fifth transistor 135 to the drain of the sixth transistor 136 outputs the high level. The first transistor 14 and the second transistor 15 are turned on after receiving the high level, and pull down the input voltage greater than or equal to the threshold voltage to the target voltage, such that the fully-differential operational amplifier 20 operates at the target voltage.

In this embodiment, the comparator 13 has a simple structure, which reduces the overall area of the startup circuit device 10. In addition, since no current flows in the static state, there is no need to provide additional threshold voltage, which thereby reduces the power consumption of the startup circuit device 10.

In another embodiment, the comparator 13 includes a comparison module 137 and a reference voltage source 139. A reference voltage provided by the reference voltage source 139 is the threshold voltage.

The comparison module 137 includes a first comparison input terminal 138 and a second comparison input terminal 138'. The first comparison input terminal 138 serves as the input terminal 131 of the comparator, the second comparison input terminal 138' is connected to an end of a reference voltage source 139, and another end of the reference voltage source 139 is grounded. An output terminal of the comparison module 137 serves as the output terminal of the comparator and is connected to both the gate of the first transistor 14/14' and the gate of the second transistor 15/15'.

Figure 6:
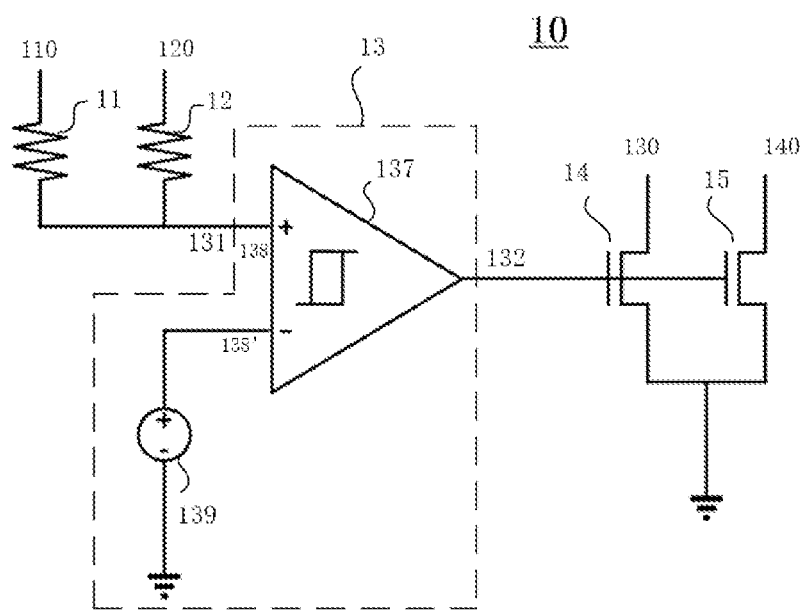
FIG. 6 is a schematic structural diagram of another comparator according to an embodiment of the present disclosure.

In an example, as shown in FIG. 6, the first comparison input terminal 138 (the input terminal 131 of the comparator) of the comparison module 137 is configured to receive the input voltage and compare the input voltage with the threshold voltage provided by the reference voltage source 139. The high level is output when the input voltage is greater than the threshold voltage. After receiving the high level, the first transistor 14 and the second transistor 15 are turned on to pull down the input voltage to the target voltage. When the input voltage is pulled down to the target voltage, the input voltage is less than or equal to the threshold voltage, and the low level is output. After receiving the low level, the first transistor 14 and the second transistor 15 are turned off to enable the fully-differential operational amplifier 20 to operate at the target voltage.

Figure 7:
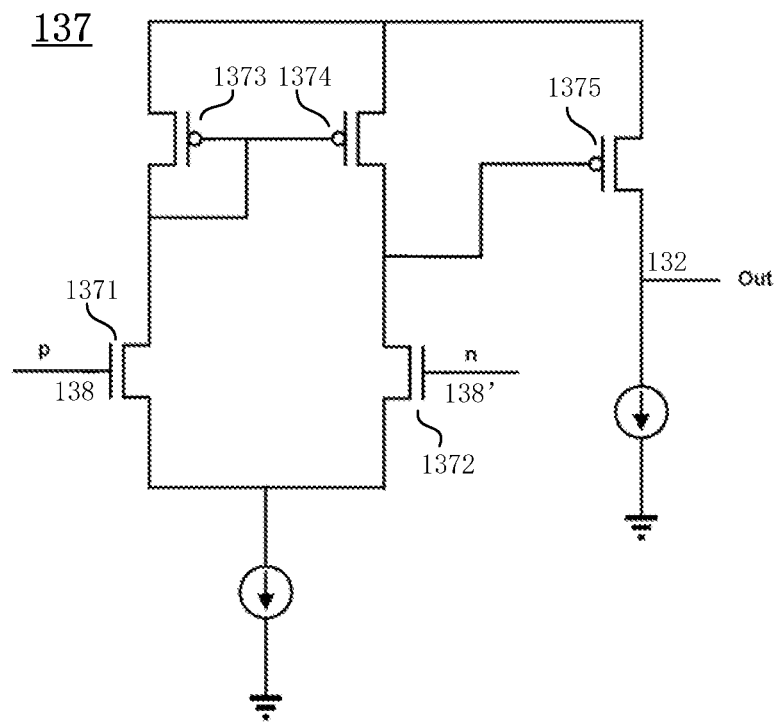
FIG. 7 is a schematic structural diagram of a comparison module according to an embodiment of the present disclosure.

In an embodiment, as shown in FIG. 7, the comparison module 137 includes a seventh transistor 1371, an eighth transistor 1372, a ninth transistor 1373, a tenth transistor 1374, and a eleventh transistor 1375.

A gate of the seventh transistor 1371 serves as the first comparison input terminal, a gate of the eighth transistor 1372 serves as the second comparison input terminal 138', and a source of the seventh transistor 1371 and a source of the eighth transistor 1372 of the comparison module are connected to each other and grounded.

A drain of the seventh transistor 1371 is connected to a drain of the ninth transistor 1373, a drain of the eighth transistor 1372 is connected to a drain of the tenth transistor 1374, a drain of the ninth transistor 1373 is connected to a gate of the ninth transistor 1373, and a gate of the ninth transistor 1373 is connected to a gate of the tenth transistor 1374.

A source of the ninth transistor 1373, a source of the tenth transistor 1374, and a source of the eleventh transistor 1375 are connected; a gate of the eleventh transistor 1375 is connected to a drain of the tenth transistor 1374; and a drain of the eleventh transistor 1375 is grounded and serves as the output terminal of the comparison module 137.

Of course, the comparison module 137 may also be other types of modules with comparison functions, all of which fall within the protection scope of this embodiment.

In an embodiment, a filter is provided. The filter includes the startup circuit device according to the aforesaid embodiments. When a plurality of fully-differential operational amplifiers are connected in series in the filter, the startup circuit device may be provided at the input terminal of each fully-differential operational amplifier in an adaptive selection way, so that each fully-differential operational amplifier can operate stably at the target voltage during startup.

Figure 8:
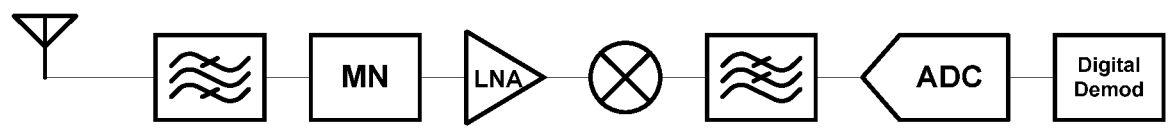
FIG. 8 is a schematic structural diagram of a receiver according to an embodiment of the present disclosure.

As shown in FIG. 8, a receiver includes a first band-pass filter or low-pass filter in series, a matching network (MN), a low noise amplifier (LNA), a mixer, a second band-pass filter or low-pass filter, an analog-to-digital converter, and a digital demodulator. Applying the startup circuit device according to this embodiment may effectively improve operating stability of the filter, which can thereby improve operating stability of the receiver and reduce the power consumption effectively.

The aforesaid embodiments do not constitute a limitation on the protection scope of the present disclosure. Those skilled in the art shall understand that various modifications, combinations, sub-combinations and substitutions may be made according to design requirements and other factors. The modification, equivalent replacement, improvement, or the like made according to the spirit and principle of the present disclosure shall be regarded as within the protection scope of the present disclosure.

What is claimed is:

1. A startup circuit device, applicable to a filter comprising a fully-differential operational amplifier and a common-mode feedback circuit device connected in sequence,
    wherein the startup circuit device comprises a first startup input terminal, a second startup input terminal, a first startup output terminal and a second startup output terminal, with both the first startup input terminal and the first startup output terminal being connected to a first amplification input terminal of the fully-differential operational amplifier, and both the second startup input terminal and the second startup output terminal being connected to a second amplification input terminal of the fully-differential operational amplifier; and
    the startup circuit device is configured to adjust a received input voltage to a target voltage during startup of the fully-differential operational amplifier, and output the target voltage to the fully-differential operational amplifier, such that the fully-differential operational amplifier operates at the target voltage,
    wherein the startup circuit device comprises a first resistor, a second resistor, a comparator, a first transistor, and a second transistor, wherein an end of the first resistor serves as the first startup input terminal, and an end of the second resistor serves as the second startup input terminal; both the other end of the first resistor and the other end of the second resistor are connected to an input terminal of the comparator; and an output terminal of the comparator is connected to both a gate of the first transistor and a gate of the second transistor;

the gate of the first transistor and the gate of the second transistor are connected to each other, a drain of the first transistor serves as the first startup output terminal, a drain of the second transistor serves as the second startup output terminal, and both a source of the second transistor and a source of the first transistor are grounded or connected to a power supply terminal $V_{DD}$;

the input terminal of the comparator is configured to receive an average value of the input voltage, the average value being acquired by dividing the input voltage by the first resistor and the second resistor; and the output terminal of the comparator is configured to output a high level or a low level based on a comparison result between a threshold voltage and the average value of the input voltage; and the first transistor and the second transistor are configured to pull up or down the average value of the input voltage to the target voltage according to the high level or the low level, wherein the threshold voltage is greater than or equal to the target voltage.

2. The startup circuit device according to claim 1, wherein the output terminal of the comparator is configured to output the high level when the comparison result shows that the average value of the input voltage is greater than the threshold voltage; and the first transistor and the second transistor are both NMOS transistors, and configured to be turned on after receiving the high level and pull down the average value of the input voltage to the target voltage.

3. The startup circuit device according to claim 2, wherein the output terminal of the comparator is configured to output the low level when the average value of the input voltage is pulled down to the target voltage and less than or equal to the threshold voltage; and the first transistor and the second transistor are configured to be turned off after receiving the low level, such that the fully-differential operational amplifier operates at the target voltage.

4. The startup circuit device according to claim 1, wherein the output terminal of the comparator is configured to output the low level when the average value of the input voltage is less than the threshold voltage; and the first transistor and the second transistor are both PMOS transistors, and configured to be turned on after receiving the high level and pull up the average value of the input voltage to the target voltage.

5. The startup circuit device according to claim 1, wherein the comparator comprises a third transistor, a fourth transistor, a fifth transistor, and a sixth transistor;

a gate of the third transistor of the comparator and a gate of the fourth transistor of the comparator are connected to each other to serve as the input terminal of the comparator; both a drain of the third transistor of the comparator and a drain of the fourth transistor of the comparator are connected to a first connection point; a source of the third transistor of the comparator is connected to a source of the fifth transistor of the comparator; and a source of the fourth transistor of the comparator is grounded; and both a gate of the fifth transistor of the comparator and a gate of the sixth transistor of the comparator are connected to a second connection point which is connected to the first connection point; a drain of the fifth transistor of the comparator and a drain of the sixth transistor of the comparator are connected to each other to serve as the output terminal of the comparator; and a source of the sixth transistor of the comparator is grounded.

6. The startup circuit device according to claim 1, wherein the comparator comprises a comparison module and a reference voltage source that provides the threshold voltage; and the comparison module comprises a first comparison input terminal and a second comparison input terminal, wherein the first comparison input terminal serves as the input terminal of the comparator; the second comparison input terminal is connected to an end of the reference voltage source, and another end of the reference voltage source is grounded; and an output terminal of the comparison module serves as the output terminal of the comparator and is connected to both the gate of the first transistor and the gate of the second transistor.

7. The startup circuit device according to claim 6, wherein the comparison module comprises a seventh transistor, an eighth transistor, a ninth transistor, a tenth transistor, and an eleventh transistor;

a gate of the seventh transistor of the comparison module serves as the first comparison input terminal, a gate of the eighth transistor of the comparison module serves as the second comparison input terminal, and both a source of the seventh transistor of the comparison module and a source of the eighth transistor of the comparison module are grounded;

a drain of the seventh transistor of the comparison module is connected to a drain of the ninth transistor of the comparison module; a drain of the eighth transistor of the comparison module is connected to a drain of the tenth transistor of the comparison module; a drain of the ninth transistor of the comparison module is connected to a gate of the ninth transistor of the comparison module; and a gate of the ninth transistor of the comparison module is connected to a gate of the tenth transistor of the comparison module; and a source of the ninth transistor of the comparison module, a source of the tenth transistor of the comparison module, and a source of the eleventh transistor of the comparison module are connected; a gate of the eleventh transistor of the comparison module is connected to a drain of the tenth transistor of the comparison module; and a drain of the eleventh transistor of the comparison module is grounded and serves as the output terminal of the comparison module.

8. A filter, comprising the startup circuit device according to claim 1.

9. A receiver, comprising the filter according to claim 8.

* * * * *